United States Patent
Shirakawa et al.

(10) Patent No.: US 9,948,201 B2
(45) Date of Patent: Apr. 17, 2018

(54) POWER CONVERSION APPARATUS INCLUDING TERMINALS HAVING HIGHER RESISTANCE PORTIONS

(71) Applicant: Hitachi, Ltd., Chiyoda-ku, Tokyo (JP)

(72) Inventors: Shinji Shirakawa, Tokyo (JP); Hiroshi Kamizuma, Tokyo (JP); Daisuke Matsumoto, Tokyo (JP); Akira Mima, Tokyo (JP); Yukio Hattori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 107 days.

(21) Appl. No.: 15/049,611

(22) Filed: Feb. 22, 2016

(65) Prior Publication Data
US 2016/0248338 A1    Aug. 25, 2016

(30) Foreign Application Priority Data
Feb. 23, 2015   (JP) ................ 2015-032668

(51) Int. Cl.
*H02M 7/00* (2006.01)
*H02M 5/458* (2006.01)
*H05K 7/14* (2006.01)
*H01R 13/02* (2006.01)

(52) U.S. Cl.
CPC ........... *H02M 7/003* (2013.01); *H02M 5/458* (2013.01); *H05K 7/1432* (2013.01); *H01R 13/02* (2013.01)

(58) Field of Classification Search
CPC ........ H01R 13/64; H01R 13/66; H01R 13/33; H02M 7/003; H02M 7/53871; H02M 5/458; H05K 7/1452
See application file for complete search history.

(56) References Cited

U.S. PATENT DOCUMENTS

| | | | | |
|---|---|---|---|---|
| 4,747,783 A * | 5/1988 | Bellamy | ................ | H01R 13/03 200/268 |
| 5,881,251 A * | 3/1999 | Fung | ...................... | H02H 9/004 307/147 |
| 6,102,742 A * | 8/2000 | Daly | ................... | H01R 13/6616 338/21 |
| 6,659,783 B2 * | 12/2003 | Copper | .............. | H01R 13/6616 361/2 |
| 6,857,887 B1 * | 2/2005 | Belson | ............... | H01R 13/6616 439/181 |
| 7,371,091 B2 * | 5/2008 | Kojori | ................ | H01R 13/6616 439/181 |

(Continued)

FOREIGN PATENT DOCUMENTS

JP         5-284748 A     10/1993

*Primary Examiner* — Jue Zhang
*Assistant Examiner* — Jye-June Lee
(74) *Attorney, Agent, or Firm* — Crowell & Moring LLP

(57) ABSTRACT

A module of conversion circuit includes a High side IGBT, a Low side IGBT connected in series to the High side IGBT, a first terminal connected to the High side IGBT, a second terminal connected to the Low side IGBT, a capacitor connected to the first terminal and the second terminal, and a third terminal connected to a connection point between the High side IGBT and the Low side IGBT. A fourth terminal is engaged with the first terminal. A fifth terminal is engaged with the second terminal. A sixth terminal is engaged with the third terminal. The first and second terminals have at portions thereof between front edges and rear edges high-resistance parts having higher resistance than other portions.

9 Claims, 10 Drawing Sheets

(56) References Cited

U.S. PATENT DOCUMENTS

| | | | | |
|---|---|---|---|---|
| 9,190,927 B2* | 11/2015 | Stockinger | ............ | H02M 7/003 |
| 2007/0298638 A1* | 12/2007 | Kojori | .................... | H01R 13/03 |
| | | | | 439/181 |
| 2008/0174966 A1* | 7/2008 | Badger | ................ | H02M 7/003 |
| | | | | 361/709 |
| 2016/0124046 A1* | 5/2016 | Kang | ....................... | G01K 7/22 |
| | | | | 324/415 |

* cited by examiner

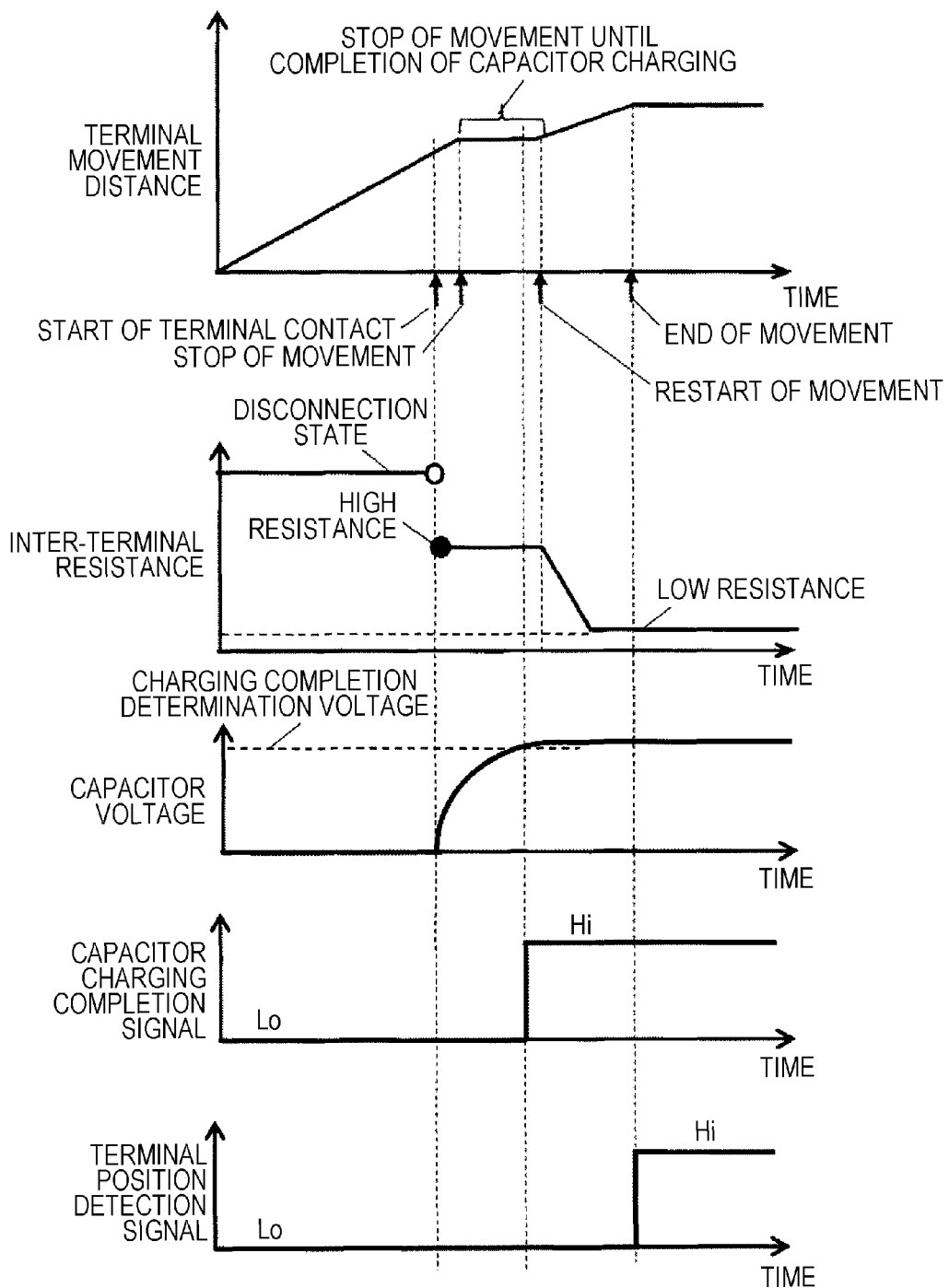

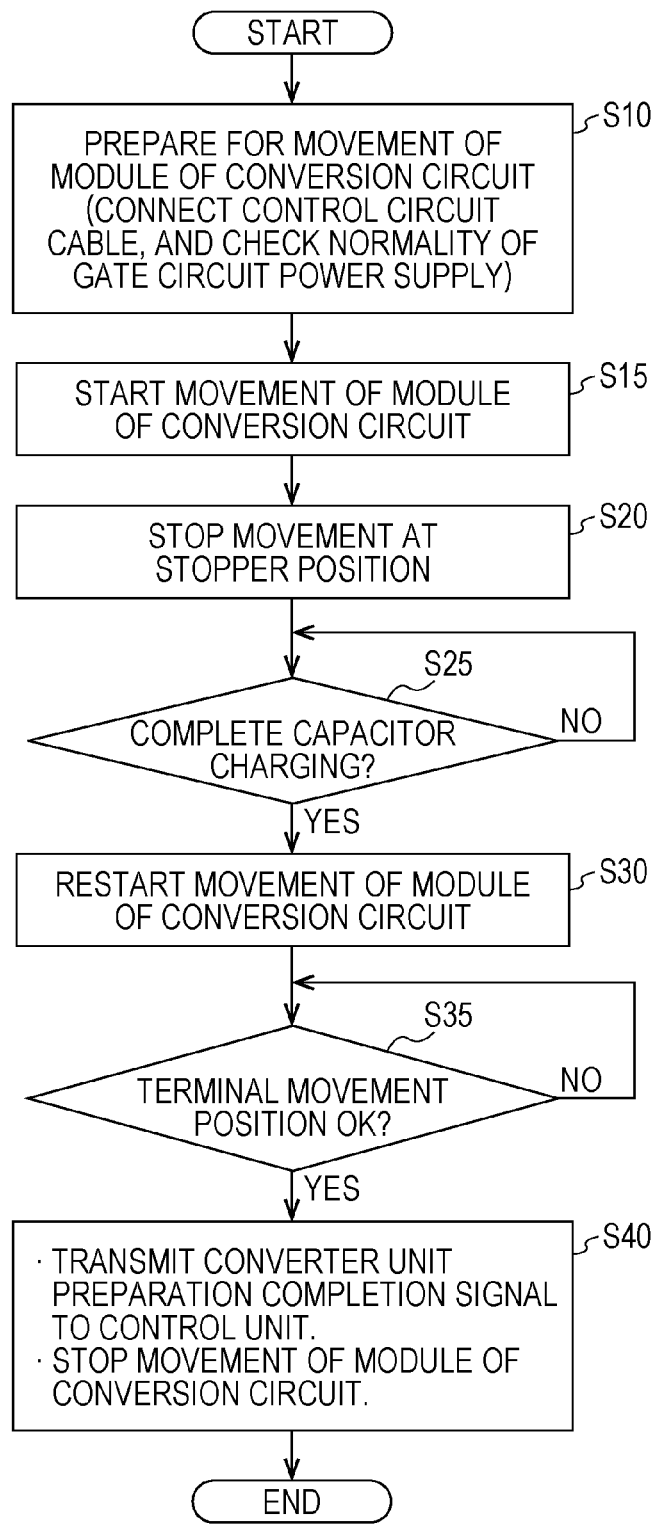

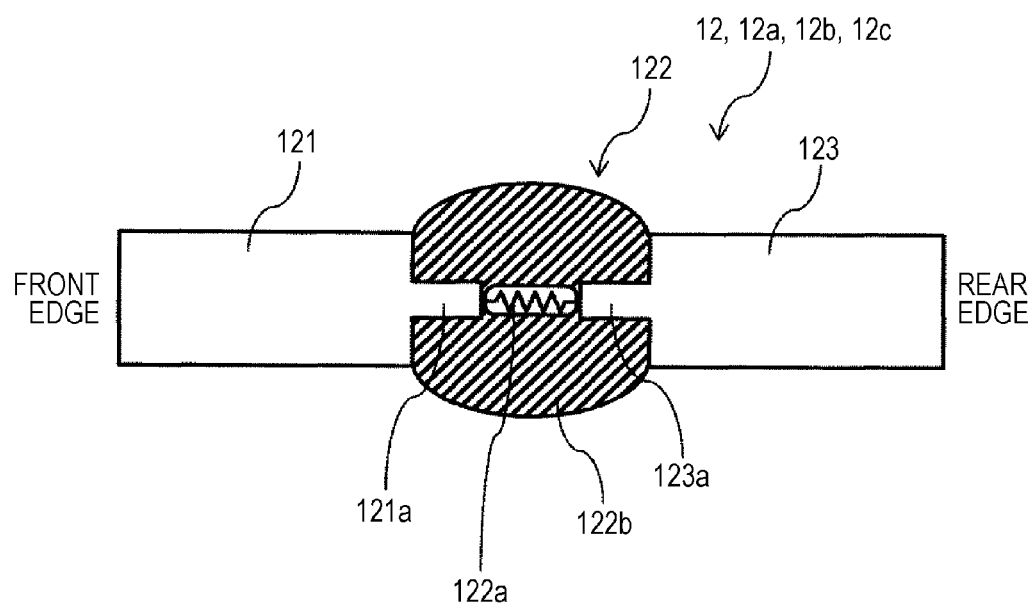
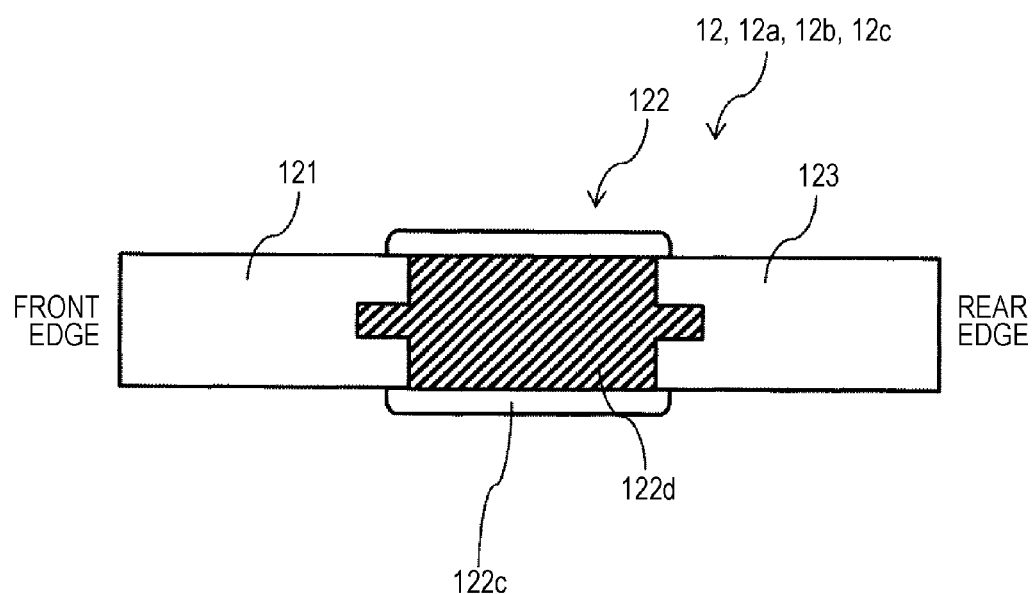

POWER CONVERSION APPARATUS INCLUDING TERMINALS HAVING HIGHER RESISTANCE PORTIONS

BACKGROUND OF THE INVENTION

1. Field of the Invention

The present invention relates to a power conversion apparatus.

2. Description of the Related Art

In a power conversion apparatus inputting and outputting three-phase alternating-current power, a minimum configuration of a conversion circuit for one phase (hereinbelow referred to as a module of conversion circuit) includes a half-bridge circuit including two semiconductor switches and diodes connected in parallel with the respective semiconductor switches, a capacitor connected between a positive electrode side and a negative electrode side, a conductor wire electrically connecting these parts, and a gate driving circuit. The gate driving circuit is a circuit turning on/off the semiconductor switches in response to a signal from a control circuit on top of a system.

Meanwhile, a capacity increase of the power conversion apparatus can be achieved by connecting in parallel as many modules of conversion circuit as necessary and using a circuit combining output terminals of the half-bridge circuits as the conversion circuit for one phase. In the case in which the plurality of modules of conversion circuit are used, disconnection (detachment) of the aforementioned parallel connection and connection are desirably simple from a viewpoint of efficiency of maintenance.

On the other hand, in a case of connecting the conversion circuit including the capacitor to a power supply, when the amount of charging current to the uncharged capacitor is excessive, heat is generated at a capacitor terminal portion significantly. In relation to this, a rectifier including a capacitor inrush current prevention circuit is known (for example, refer to JP-5-284748-A.)

SUMMARY OF THE INVENTION

In the technique disclosed in JP-5-284748-A, a circuit constituting an apparatus cannot be disconnected. Thus, in a case in which the circuit fails, the circuit cannot be replaced easily, An aspect of the present invention provides a power conversion apparatus enabling a circuit constituting the apparatus to be replaced easily while suppressing charging current to an uncharged capacitor.

In order to achieve the object, a power conversion apparatus according to the present invention includes module of conversion circuit including a first switching element, a second switching element connected in series to the first switching element, a first terminal connected to the first switching element, a second terminal connected to the second switching element, a capacitor connected to the first terminal and the second terminal, and a third terminal connected to a connection point between the first switching element and the second switching element; a fourth terminal engaged with the first terminal; a fifth terminal engaged with the second terminal; and a sixth terminal engaged with the third terminal, wherein the first and second terminals have at portions thereof between front edges and rear edges high-resistance parts having higher resistance than other portions.

The present invention enables a circuit constituting an apparatus to be replaced easily while suppressing charging current to an uncharged capacitor.

BRIEF DESCRIPTION OF THE DRAWINGS

Other objects and advantages of the invention will become apparent from the following description of embodiments with reference to the accompanying drawings in which:

FIG. 3 illustrates respective physical quantities corresponding to the terminal connection states in FIGS. 2A to 2C;

FIG. 4 is a flowchart of movement of a module of conversion circuit;

FIG. 10 is a configuration diagram of the terminal according to a first modification example of the present invention; and FIG. 11 is a configuration diagram of the terminal according to a second modification example of the present invention.

DESCRIPTION OF THE PREFERRED EMBODIMENTS

Figure 1:
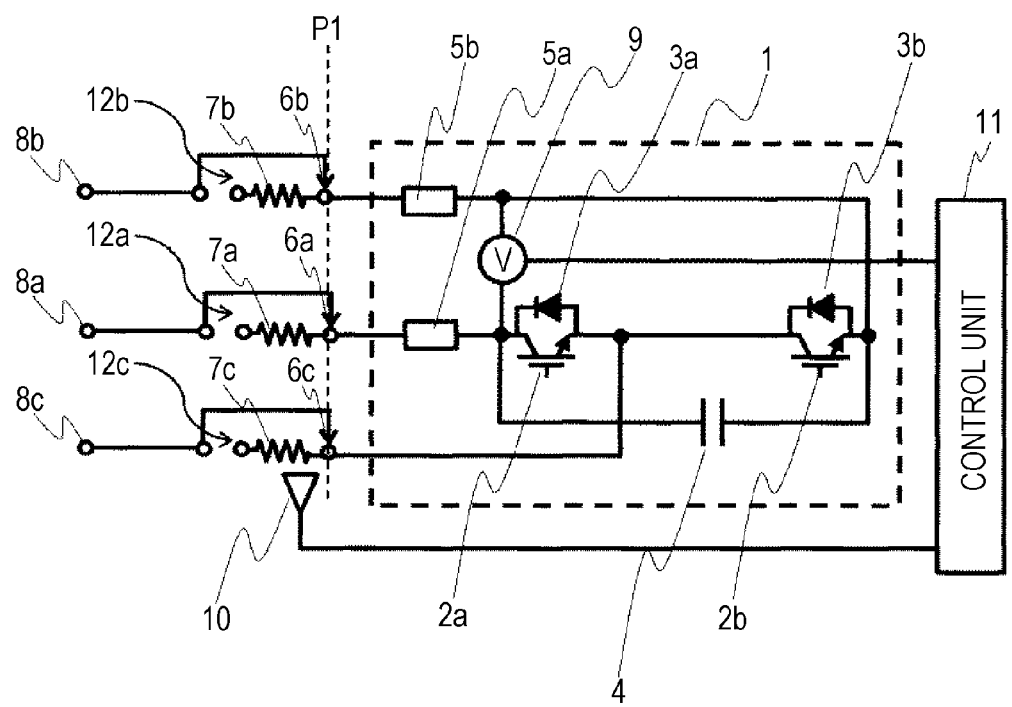
FIG. 1 is a circuit configuration diagram according to a first embodiment of the present invention.

Configurations and effects of a power conversion apparatus according to first to second embodiments of the present invention will be described below with reference to the accompanying drawings, wherein, like reference numerals refer to like parts throughout.

The first to second embodiments of the present invention aim to achieve the following aspects. A first aspect is to detect that a module of conversion circuit is ready for starting operation as a circuit of the power conversion apparatus. Specifically, the first aspect is to detect that a terminal portion of the module of conversion circuit is located at a position required to fulfill a function thereof and is connected with low resistance, and that capacitor voltage is voltage ready for starting operation. A second aspect is to suppress current flowing into a capacitor and a fuse of the module of conversion circuit immediately after terminal connection in a configuration using terminals having a structure in which one terminal is pinched by the other terminal.

Main points of the first to second embodiments of the present invention are, in the module of conversion circuit inserting a pinched terminal into a Clothespin-type terminal for electric connection, a point in which a unit detecting a position of the module of conversion circuit or the pinched terminal is provided, and in which a unit transmitting the position of the module of conversion circuit or the pinched terminal to a control unit of a system is provided, and a point in which a front edge part of the pinched terminal is made of a high-resistance material, and in which a circuit detecting capacitor voltage of the module of conversion circuit is provided.

For example, the power conversion apparatus is a converter rectifying alternating voltage and converting the alternating voltage into direct voltage or an inverter converting direct voltage into alternating voltage with use of a semiconductor switch such as an IGBT (insulated gate bipolar transistor) and a MOSFET (metal oxide semiconductor field effect transistor) and a diode.

First Embodiment

FIG. 1 is a circuit configuration diagram according to the first embodiment of the present invention. FIG. 1 is a configuration example in a case in which pinched terminals 12a, 12b, and 12c to be inserted into Clothespin type terminals 6a, 6b, and 6c are provided in a module of conversion circuit 1. The module of conversion, circuit 1 in FIG. 1 includes a half-bridge circuit, including IGBTs 2a and 2b and diodes 3a and 3b, a capacitor 4, a gate driving circuit turning on/off the IGBTs 2a and 2b, and a wire connecting these parts.

In FIG. 1, the terminals 6a and 6b are terminals to which direct voltage is applied. The terminal 6a is a positive electrode terminal, the terminal 6b is a negative electrode terminal, and the terminal 6c is an output terminal. The gate driving circuit is controlled by a signal from a control unit 11 controlling the power conversion apparatus, and FIG. 1 omits the gate driving circuit, a signal wire from the control unit 11, and a power supply wire.

Also, in the module of conversion circuit 1 in FIG. 1, fuses 5a and 5b are parts adapted to interrupt short-circuit current at the time of a short-circuit fault. Some power conversion apparatuses do not include the fuses 5a and 5b, and the module of conversion circuit 1 in FIG. 1 is configured to include the fuses 5a and 5b since the fuses 5a and 5b relate to one of the aspects to be achieved by the present embodiment.

Terminals 8a, 8b, and 8c are terminals allowing the module of conversion circuit 1 to be electrically connected to another module of conversion circuit, or connected to input/output wires. The terminal 8a is connected to a positive electrode side of another module of conversion circuit, the terminal 8b is connected to a negative electrode side of another module of conversion circuit, and the terminal 8c is connected to an input or an output of alternating voltage and current.

In this manner, the module of conversion circuit 1 includes the IGBT 2a (a first switching element), the IGBT 2b (a second switching element) connected in series to the first switching element, the terminal 12a (a first terminal) connected to the first switching element, the terminal 12b (a second terminal) connected to the second switching element, the capacitor 4 connected to the first terminal and the second terminal, and the terminal 12c (a third terminal) connected to a connection point between the first switching element and the second switching element.

Figure 2A:
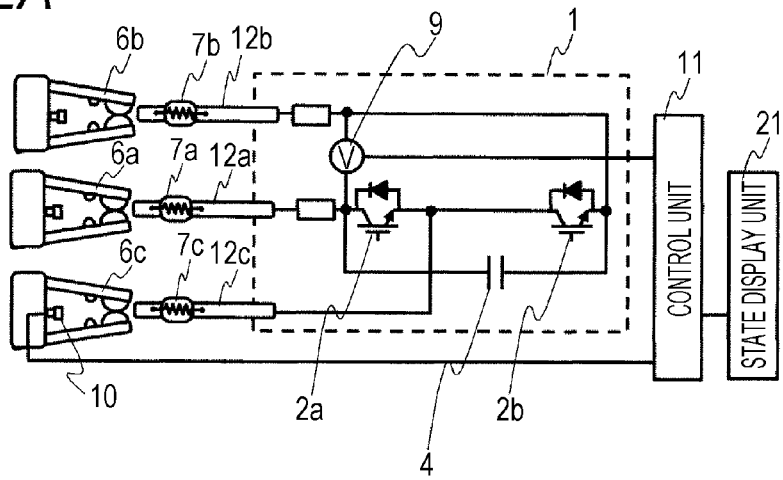
FIG. 2A illustrates positional relationship between Clothespin-type terminals and pinched terminals in a disconnection state.
Figure 2B:
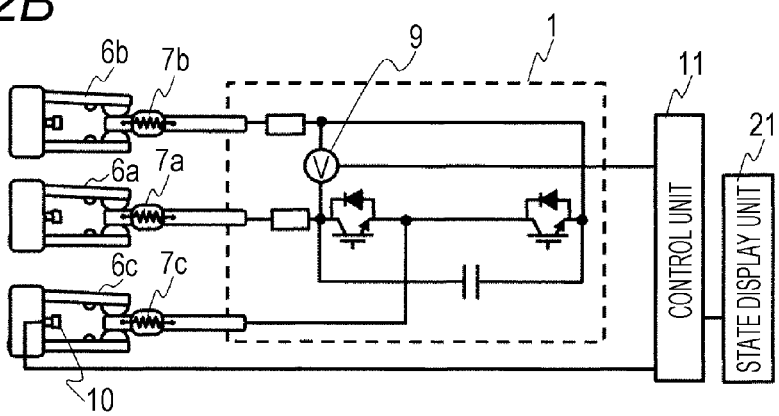
FIG. 2B illustrates positional relationship between the Clothespin-type terminals and the pinched terminals in a high-resistance connection state.
Figure 2C:
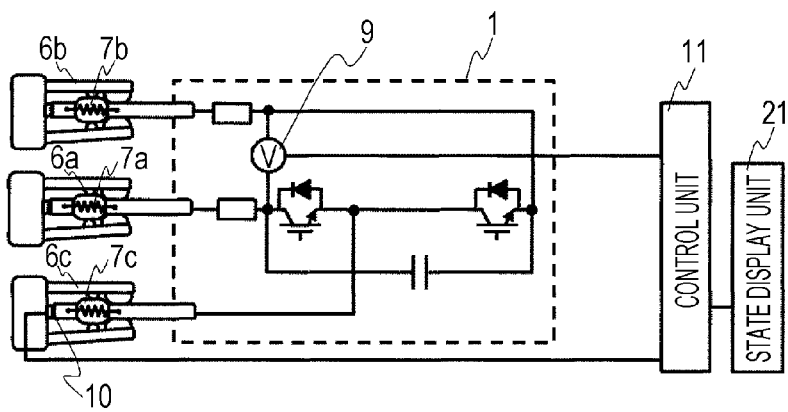
FIG. 2C illustrates positional relationship between the Clothespin-type terminals and the pinched terminals in a low-resistance connection state.

FIGS. 2A to 2C illustrate positional relationship between the Clothespin-type terminals 6a, 6b, and 6c and the pinched terminals 12a, 12b, and 12c in a procedure of terminal connection.

In the figures, the Clothespin-type terminal 6a (a fourth terminal) is engaged (fitted) with the terminal 12a (the first terminal). The Clothespin-type terminal 6b (a fifth terminal) is engaged with the terminal 12b (the second terminal). The Clothespin-type terminal 6c (a sixth terminal) is engaged with the terminal 12c (the third terminal). The present embodiment has a structure in which the Clothespin-type terminals 6a, 6b, and 6c (the fourth to sixth terminals) respectively pinch the terminals 12a, 12b, and 12c (the first to third terminals).

In FIGS. 2A to 2C, resistance materials or parts 7a, 7b, and 7c are used for portions of the pinched terminals 12a, 12b, and 12c. That is, the terminals 12a, 12b, and 12c (the first to third terminals) have at portions thereof between front edges and rear edges the parts 7a, 7b, and 7c having higher resistance than other portions. Meanwhile, an alloy may be used as the resistance material.

A state display unit 21 in FIGS. 2A to 2C is a means for transmitting a state of the module of conversion circuit 1 to an outside and transmits (displays) information for determination of start or stop of movement of the module of conversion circuit 1 to one controlling an external force (a user) in a case in which no external force for moving the module of conversion circuit 1 exists under electronic control of the control unit 11. Examples of the state display unit 21 are a display unit and an indicator.

FIG. 3 illustrates changes of respective physical quantities with horizontal axes thereof indicating time in the procedure of terminal connection. FIG. 4 is a flowchart of movement of the module of conversion circuit 1. Hereinbelow, effects of the module of conversion circuit 1 according to the first embodiment of the present invention will be described with reference to FIGS. 1 to 4.

FIG. 1 expresses states of electric connection of the Clothespin-type terminals 6a, 6b, and 6c with arrows and illustrates a state in which the pinched terminals 12a, 12b, and 12c of the module of conversion circuit 1 are inserted up to a position P1 for low-resistance connection. A voltage detector 9 is a unit measuring capacitor voltage and transmitting a comparison result with voltage for determining charging completion to the control unit 11.

A position detector 10 illustrated in FIGS. 2A to 2C is a unit detecting positions of the terminals 12a, 12b, and 12c on a side of the module of conversion circuit 1 and transmitting the information to the control unit 11. In (i) disconnection state in FIG. 2A, a state in which the terminals 12a, 12b, and 12c of the module of conversion circuit 1 do not contact the Clothespin-type terminals 6a, 6b, and 6c is illustrated. This state is a state of preparation for insertion of the module of conversion circuit in the flowchart in FIG. 4 (step S10).

The state of preparation for insertion of the module of conversion circuit is a state in which the control unit 11 and the module of conversion circuit 1 are connected by a cable, in which a power supply of the gate driving circuit is operated normally, and in which the gate driving circuit is under control of the control unit 11. In this state, the gate driving circuit sets gate voltage of the IGBTs to voltage of equal or lower potential to or than emitter voltage to turn the IGBTs off. From this state, insertion of the module of conversion circuit 1 is started in accordance with the flowchart in FIG. 4.

When movement is started as illustrated in FIG. 3 (step S15 in FIG. 4), and the terminals 12a, 12b, and 12c then start contacting the Clothespin-type terminals 6a, 6b, and 6c, the state moves from disconnection state in FIG. 2A to (ii) high-resistance connection state in FIG. 2B. In (ii) high-resistance connection state, movement of the module of conversion circuit temporarily stops. More specifically, movement of the module of conversion circuit stops at a stopper position (step S20 in FIG. 4). The stopper will be described in detail below with reference to FIGS. 7A to 7C.

From the time the terminals contact, charging of the capacitor 4 is started by direct voltage E applied to the terminal 6a and the terminal 6b. Here, capacitor charging current $I=(E/R) \exp\{-(1/RC)*time\}$ is established where R is resistance of the resistance materials or the parts 7a and 7b for the two terminals, C is a capacitor capacity, and wiring inductance is ignored. Accordingly, this charging current I can be suppressed to E/R or less by the resistance R.

Here, the resistance materials or the parts 7a and 7b are selected so that a value of capacitor charging current $I_0=E/R$ when time t=0 may be current keeping heat generation of the capacitor terminal within an allowable range and be equal to or less than fusing current of the fuses. On the other hand, when the module of conversion circuit is operated as an inverter or a converter while (ii) high-resistance connection state is kept, current will keep flowing into the high-resistance materials or the parts 7a and 7b, which causes a great power loss.

For this reason, to let the module of conversion circuit function as a power conversion apparatus, inter-terminal resistance needs to be in a low-resistance state, being in the low-resistance state needs to be transmitted to the control unit 11, and the gate driving circuit needs to start operation under control of the control unit 11. In the embodiment of the present invention, capacitor voltage is measured by the voltage detector 9 in FIG. 1, and charging completion is determined by comparison with charging completion determination voltage (a threshold value) as illustrated in FIG. 3 (step S25 in FIG. 4). A capacitor charging completion signal is transmitted to the control unit 11 and the state display unit 21.

At this time, the voltage detector 9 (a voltage sensor) detects voltage of the capacitor 4. The control unit 11 determines based on the voltage of the capacitor 4 detected by the voltage detector 9 whether or not charging of the capacitor 4 has been completed. The state display unit 21 (a display unit) displays a result determined by the control unit 11.

As illustrated in FIG. 4, after the capacitor charging completion is confirmed (step S25: YES), movement of the module of conversion circuit is restarted (step S30 in FIG. 4). The module of conversion circuit 1 is moved until (iii) low-resistance connection state in FIG. 2C is reached, and it is difficult to determine the low-resistance connection state from the inter-terminal resistance value.

Thus, in the embodiment of the present invention, at least one unit 10 detecting positional relationship between the pinched terminals 12a, 12b, and 12c and the Clothespin-type terminals 6a, 6b, and 6c is provided as illustrated in FIG. 1. By doing so, the unit 10 transmits the fact that the module of conversion 1 has moved to the position P1, at which the module of conversion circuit 1 is in (iii) low-resistance connection state, to the control unit 11 and the state display unit 21, and the module of conversion circuit 1 stops movement (step S40 in FIG. 4).

At this time, the unit 10 (a position sensor) detects a position of at least one out of the terminals 12a, 12b, and 12c (the first to third terminals). The control unit 11 determines based on the position detected by the position sensor whether or not the terminals 12a, 12b, and 12c (the first to third terminals) respectively contact the Clothespin-type terminals 6a, 6b, and 6c (the fourth to sixth terminals) further on the rear edge sides thereof than the high-resistance parts 7a, 7b, and 7c (step S35 in FIG. 4). The state display unit 21 (the display unit) displays a result determined by the control unit 11.

Meanwhile, to the unit 10 detecting positional relationship, a compression-spring-type switch as illustrated in FIGS. 2A to 2C or a gate switch using a length measurement sensor or an optical sensor is applicable.

Figure 5:
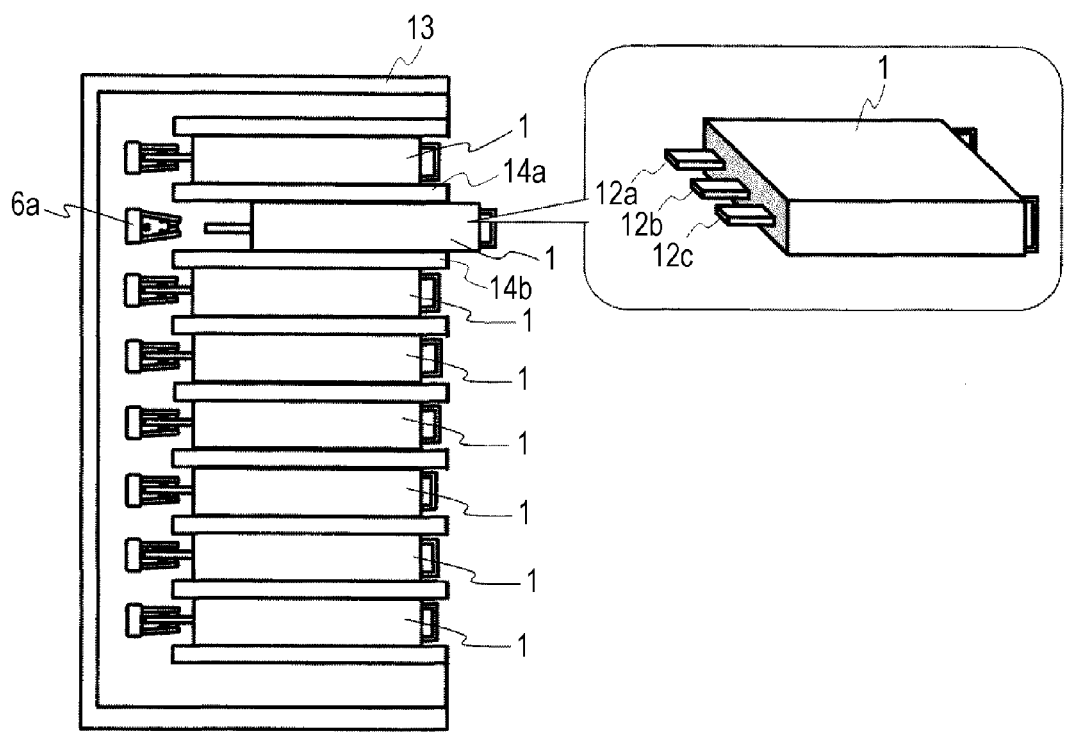
FIG. 5 illustrates a power conversion apparatus using the plurality of modules of conversion circuit according to the first embodiment.

FIG. 5 illustrates a power conversion apparatus using the plurality of modules of conversion circuit 1 according to the first embodiment. In FIG. 5, the plurality of modules of conversion circuit 1 are housed in a chassis 13, the Clothespin-type terminals 6a, 6b, and 6c provided on a side of the chassis are respectively connected to the terminals 12a, 12b, and 12c to constitute the power conversion apparatus.

Figure 6:
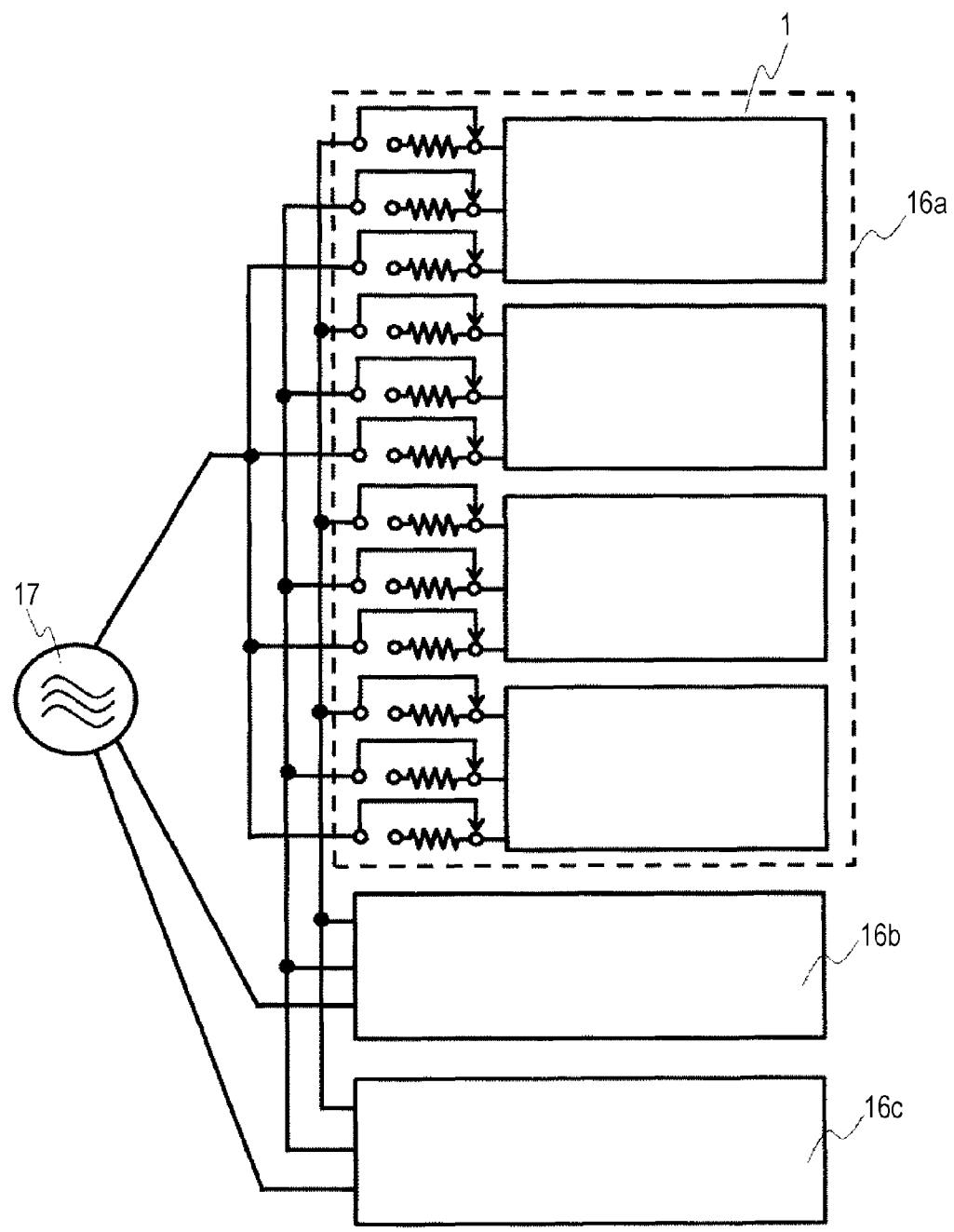
FIG. 6 is a connection example in which the present invention has been applied to a three-phase alternating-current power conversion apparatus in which four modules of conversion circuit connected in parallel constitute each conversion circuit for one phase.

FIG. 6 is a connection example in which the present invention has been applied to a three-phase alternating-current power conversion apparatus in which four modules of conversion circuit 1 connected in parallel constitute each conversion circuit for one phase 16a. In the configuration illustrated in FIG. 6, in a case in which one module of conversion circuit 1 is replaced according to the embodiment of the present invention described in FIGS. 1 to 4, the module of conversion circuit 1 is pulled in a state in which all the IGBTs of the module of conversion circuit 1 are turned off, and a replacement module can be inserted. Meanwhile, in the embodiment of the present invention, since the terminal connection resistance changes from a high-resistance state to a non-connection state at the time of pulling, generation of arc between the terminals can be suppressed.

Figure 7A:
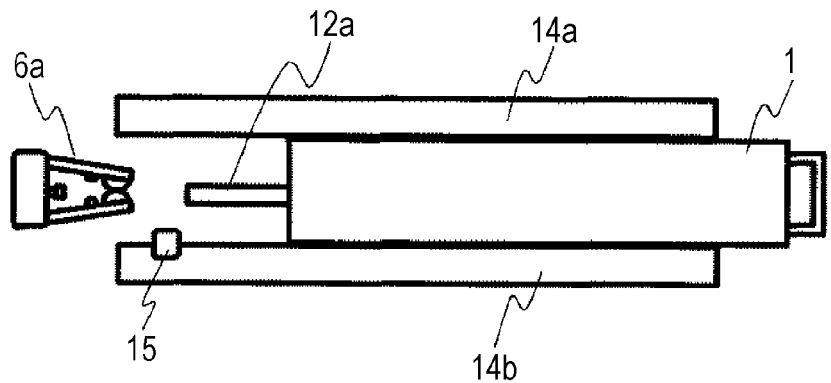
FIG. 7A illustrates positional relationship between the module of conversion circuit and a stopper in the disconnection state.
Figure 7B:
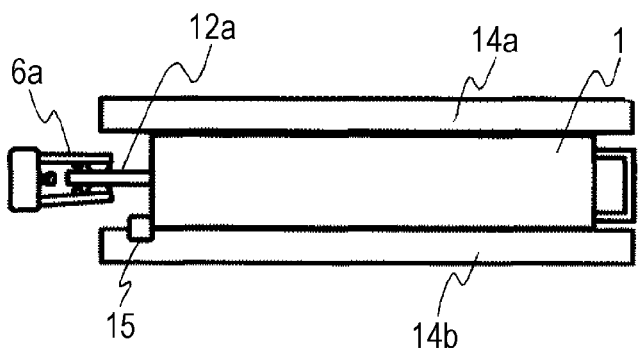
FIG. 7B illustrates positional relationship between the module of conversion circuit and the stopper in the high-resistance connection state.
Figure 7C:
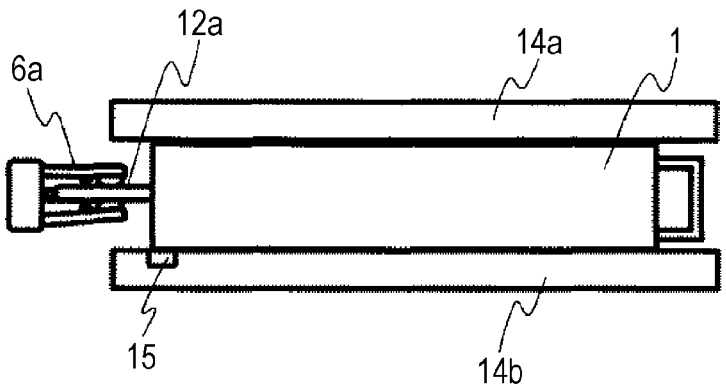
FIG. 7C illustrates positional relationship between the module of conversion circuit and the stopper in the low-resistance connection state.

FIGS. 7A to 7C illustrate a method for stopping the module of conversion circuit at a position for (ii) high-resistance connection state illustrated in FIGS. 2A to 2C in the embodiment of the module of conversion circuit illustrated in FIG. 5.

In FIGS. 2A to 2C, the terminals 12a, 12b, and 12c are partially thickened, and it is implied that detecting that the module of conversion circuit is located at a position for (ii) high-resistance connection state is triggered by alteration in movement load of the module of conversion circuit. However, in FIGS. 7A to 7C, a stopper 15 is provided at either one of structures 14a and 14b guiding movement of the chassis of the module of conversion circuit 1 so that the stopper 15 may stop the terminal 12a at the position for (ii) high-resistance connection state.

In other words, the stopper 15 (a stopper mechanism) limits movement of the module of conversion circuit 1 so that the terminals 12a, 12b, and 12c (the first to third terminals) may respectively contact the Clothespin-type terminals 6a, 6b, and 6c (the fourth to sixth terminals) at positions further on the front edge sides thereof than the high-resistance parts 7a, 7b, and 7c.

Thereafter, charging completion is determined from the capacitor charging completion signal in FIG. 3, the stopper 15 is released, and the terminal 12a is moved to reach (iii) low-resistance connection state. At this time, the voltage detector 9 (the voltage sensor) detects voltage of the capacitor 4. The control unit 11 functions as a determination section determining based on the voltage of the capacitor 4 detected by the voltage detector 9 whether or not charging of the capacitor 4 has been completed and as a stopper control section controlling the stopper 15 (the stopper mechanism) to release the limit of movement of the module of conversion circuit 1 when it is determined that charging of the capacitor 4 has been completed.

As described above, according to the present embodiment, a circuit constituting an apparatus can be replaced easily while suppressing charging current to an uncharged capacitor (a smoothing capacitor).

In particular, to suppress current flowing into the capacitor 4 and the fuses 5a and 5b of the module of conversion circuit 1, the terminal portion of the module of conversion circuit 1 needs to be electrically connected with high resistance immediately after terminal connection, and the high-resistance state needs to be kept until charging of the capacitor is completed. In the present embodiment, as a means for achieving this, the front edge parts of the pinched terminals 12a, 12b, and 12c as illustrated in FIG. 2 are made of the high-resistance materials, and the voltage detector 9 detecting capacitor voltage is provided.

At this time, in the high-resistance connection state, insertion is stopped to suppress charging current to the capacitor. After charging completion is determined by the sensor of capacitor voltage (the voltage detector 9), insertion of the pinched terminals into the Clothespin-type terminals is restarted.

Subsequently, to detect that the module of conversion circuit 1 is ready for starting operation as a circuit of the power conversion apparatus, the position detector 10 detecting the position(s) of the module of conversion circuit 1 or the pinched terminals 12a, 12b, and 12c is provided, and the position detector 10 detects that the module of conversion circuit 1 or the pinched terminals 12a, 12b, and 12c is(are) located at the position(s) for the low-resistance connection and transmits to the control unit 11 of the system that the module of conversion circuit 1 is ready for operation.

Consequently, the following effects are expected. Simplifying disconnection and connection of the module of conversion circuit 1 is effective for cost reduction as a result of shortening of assembling time and maintenance time.

Also, there exists a system in which an apparatus is desirably operated at all times such as a power conversion apparatus used as an uninterruptible power supply apparatus in a data center, a medical institution, or the like and a power conversion apparatus used for a motor driving apparatus for an elevator or a rolling machine for iron and steel. The system in which stop causes a loss has, as a method for continuously operating the power conversion apparatus, a method for preparing two power conversion apparatuses with required capacity and, in a case in which one stops, operating the other. In this case, initial cost for the two power conversion apparatuses and maintenance cost are required.

Conversely, in the configuration in which the plurality of modules of conversion circuit are connected in parallel, the number of the modules of conversion circuit to be connected in parallel has only to be (the number satisfying the required capacity)+1. In this configuration, in a case in which one module of conversion circuit fails or requires maintenance, the operation can be continued by the remaining modules of conversion circuit, and the cost just increases as much as one module of conversion circuit. Accordingly, this configuration achieves further cost reduction than in the case of preparing two apparatuses. Since the present embodiment is a means for solving a problem in a case of inserting a replacement module of conversion circuit into a power conversion apparatus, the present embodiment is effective for cost reduction of the power conversion apparatus configured for the purpose of continuous operation.

Second Embodiment

Figure 8:
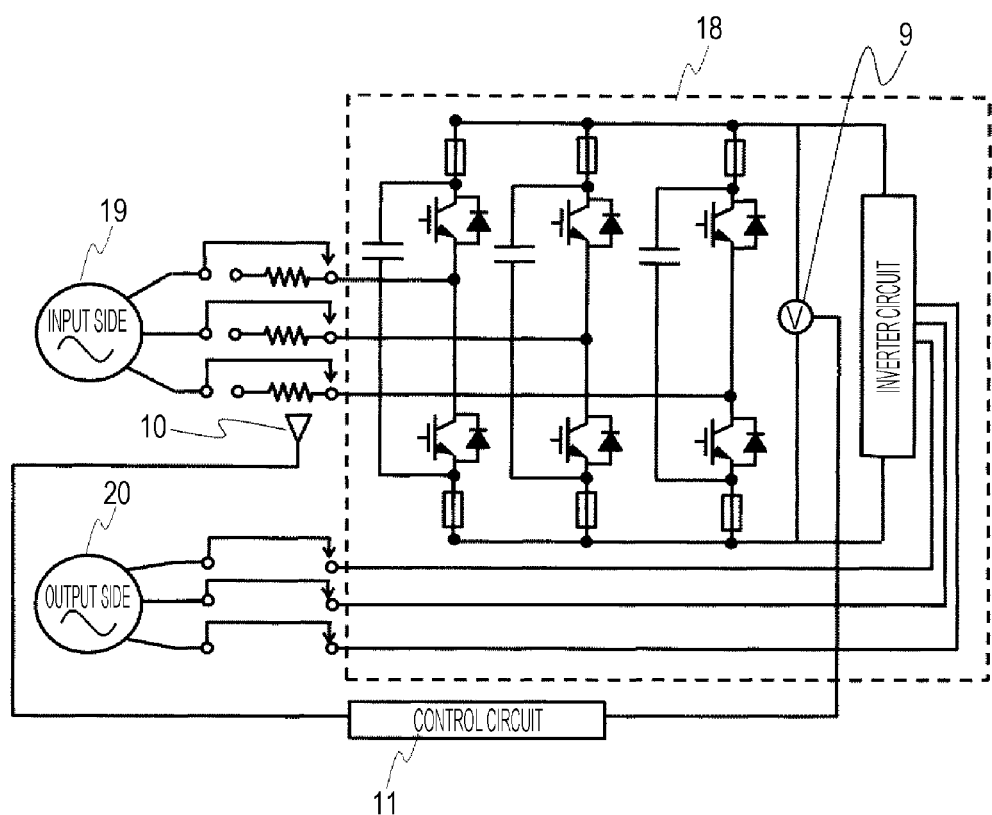
FIG. 8 is a circuit configuration diagram according to a second embodiment of the present invention.

FIG. 8 is a configuration diagram to which the present invention has been applied with a three-phase power conversion circuit 18 including a converter and an inverter used as one module. In FIG. 8, main components of the present embodiment are terminals connected to an input and an output, the unit 10 detecting position(s) of the terminals or the chassis of the three-phase power conversion circuit 18, the unit 9 detecting capacitor voltage, and the control circuit 11 to which signals from the unit 9 and the unit 10 are transmitted. It is to be noted that an inverter circuit in FIG. 8 has an equal configuration to that of the conversion circuit illustrated on the left side of the inverter circuit.

Figure 9:
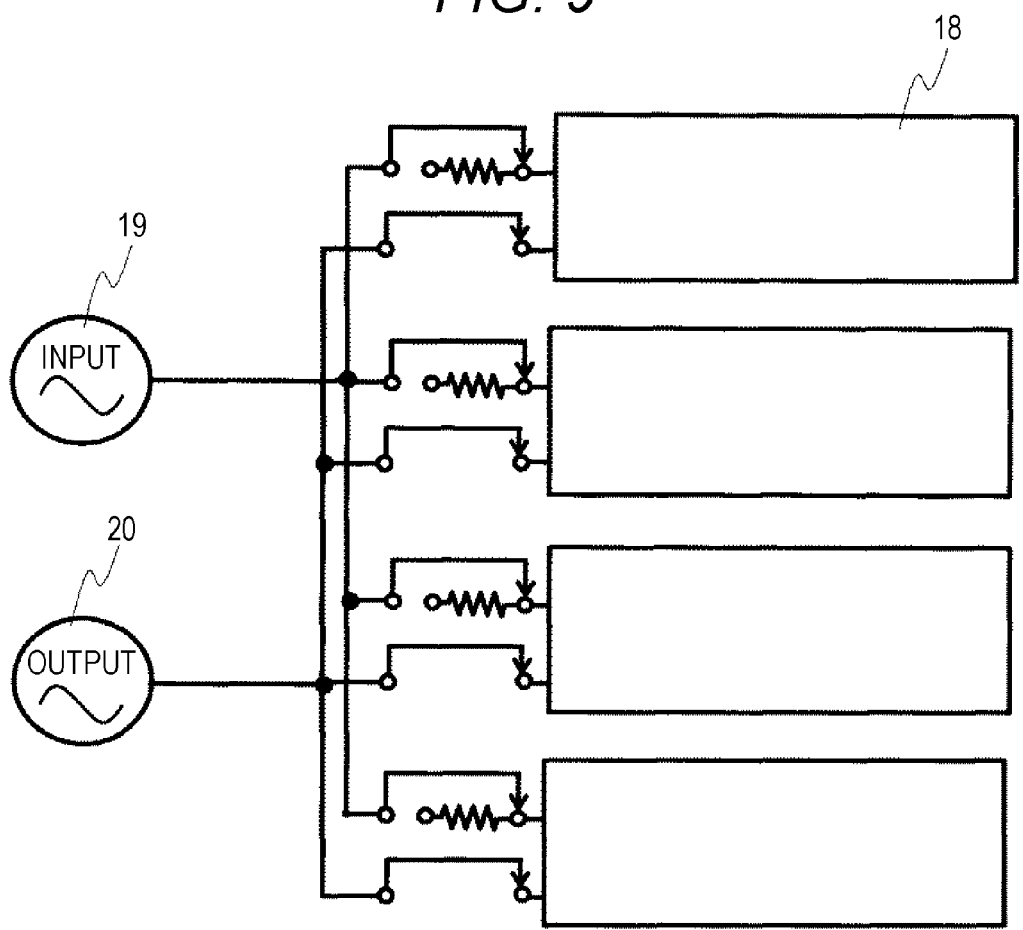
FIG. 9 is a connection diagram in a case in which a power conversion apparatus is configured with use of the second embodiment of the present invention.

FIG. 9 is a connection diagram in a case in which the four three-phase power conversion circuits 18 are arranged in parallel. In FIG. 8, positional relationship between Clothespin-type terminals on sides of an input 19 and an output 20 and pinched terminals is illustrated by arrows. FIG. 8 expresses that the lengths of the pinched terminals on the side of the output 20 are changed, and that the side of the output 20 is electrically connected when the three-phase power conversion circuit 18 is inserted up to a position at which terminal connection on the side of the input 19 becomes low-resistance connection.

Thus, in the second embodiment, the capacitor of the three-phase power conversion circuit 18 is charged in a method for diode-rectifying three-phase alternating voltage of the input 19. Accordingly, since the side of the output 20 and the three-phase power conversion circuit 18 are in a non-connection state during charging of the capacitor, the three-phase power conversion circuit 18 can charge the capacitor without disturbing output voltage and current of another power conversion circuit in FIG. 9.

In the present embodiment, as illustrated in FIGS. 2A to 2C, the terminal connected to the input side is partially made of the high-resistance material, and the voltage detector 9 detecting capacitor voltage is provided. Accordingly, capacitor charging current can be suppressed, and charging completion can be transmitted to the control circuit 11. In a similar manner to the first embodiment, the three-phase power conversion circuit 18 is moved to the low-resistance connection position P1, and the unit 10 detecting the position of the chassis transmits completion of terminal connection to the control circuit 11.

The present embodiment is an example in which the pinched terminals are shortened so that the pinched terminals may be connected to the Clothespin-type terminals on the side of the output 20 when the power conversion, circuit is moved to the position at which the terminal connection on the side of the input 19 becomes the low-resistance connection. In a case in which the configuration of the module of conversion circuit 1 in FIGS. 2A to 2C is applied to the inverter circuit illustrated in FIG. 8, this example corresponds to setting the terminal 12c (the third terminal) to be shorter than the terminals 12a and 12b (the first and second terminals).

The purpose of this structure is to prevent the capacitor charging current from flowing from the output side to the power conversion circuit. The purpose can also be achieved by setting a resistance value of the high-resistance material of the terminal connected to the output side to be higher than resistance values of the high-resistance materials of the terminals connected to the input side and setting the resistance value to a value keeping disturbance of output voltage and current waveform within an allowable range.

In a case in which this is applied to the configuration in FIGS. 2A to 2C, this corresponds to setting the resistance value of the high-resistance material the part 7c to be higher than the resistance values of the high-resistance materials or the parts 7a and 7b. That is, the high-resistance part 7c of the terminal 12c (the third terminal) has a higher resistance value than those of the terminals 12a and 12b the first and second terminals).

As described above, according to the present embodiment, it is possible to suppress current flowing from the terminal on the output side to the capacitor.

First Modification Example

FIG. 10 is a configuration diagram of the terminal 12a, 12b, or 12c according to a first modification example of the present invention.

Each of the terminals 12a, 12b, and 12c (the first to third terminals) is in a columnar shape and is configured to arrange a first part 121 having a first resistance value, a second part 122 having a second resistance value, which is higher than the first resistance value, and a third part 123 having the first resistance in this order in a direction from a front edge to a rear edge.

The second part 122 is a resistance element 122a covered with a plastic 122b. An outer circumferential surface of the second part 122 expands. Thus, when a user moves the module of conversion circuit 1 to let the terminal 12a, 12b, or 12c engaged (fitted) with the Clothespin-type terminal 6a, 6b, or 6c, a contact position of the terminal 12a, 12b, or 12c and a connection state of the Clothespin-type terminal 6a, 6b, or 6c (a high-resistance connection state or a low-resistance connection state) can be estimated by the expansion of the second part 122.

Meanwhile, in the present modification example, an edge surface of the first part 121 opposed to the plastic 122b and an edge surface of the third part 123 opposed to the plastic 122b are respectively provided with protrusions 121a and 123a, which are connected to the resistance element 122a. This can increase connection strength of the first to third parts.

Although the resistance value of the first part 121 and the resistance value of the third part 123 are equal in the above modification example, they may be different.

Second Modification Example

FIG. 11 is a configuration diagram of the terminal 12a, 12b, or 12c according to a second modification example of the present invention.

Each of the terminals 12a, 12b, and 12c (the first to third terminals) is in a columnar shape and is configured to arrange the first part 121 having the first resistance value, the second part 122 having the second resistance value, which is higher than the first resistance value, and the third part 123 having the first resistance in this order in the direction from the front edge to the rear edge.

The second part 122 is an insulating body 122d covered with a thin-film resistor 122c. Providing the thin-film resistor 122c enables a cross-sectional area of a portion of the second part 122 in which current can flow to be decreased and enables the resistance value to be higher.

Meanwhile, in the present modification example, an edge surface of the insulating body 122d opposed to the first part 121 and an edge surface of the insulating body 122d opposed to the third part 123 are respectively provided with tenons. Also, mortises fitted with these tenons are formed in the first part and the third part, respectively. This can increase connection strength of the first to third parts.

The present invention is not limited to the above embodiments and includes various modification examples. For example, each of the above embodiments is described in detail to facilitate understanding of the present invention, and the present invention is not necessarily limited to one including all the components described here. Also, partial components in one embodiment can be substituted with components in another embodiment, and components in one embodiment can be added to components in another embodiment. Also, in each embodiment, partial components can be added to, deleted from, and substituted with other components.

In each of the above embodiments, the user moves the module of conversion circuit 1. However, a mechanism in which the module of conversion circuit 1 is inserted automatically when the user partially inserts the module of conversion circuit 1 into a slot provided in the chassis 13 may be provided.

What is claimed is:

1. A power conversion apparatus comprising:
a module of conversion circuit including a first switching element, a second switching element connected in series to the first switching element, a first terminal connected to the first switching element, a second terminal connected to the second switching element, a capacitor connected to the first terminal and the second terminal, and a third terminal connected to a connection point between the first switching element and the second switching element;
a fourth terminal engaged with the first terminal;
a fifth terminal engaged with the second terminal; and
a sixth terminal engaged with the third terminal, wherein the first and second terminals have at portions thereof between front edges and rear edges high-resistance parts having higher resistance than other portions; and
the third terminal has at a portion thereof between a front edge and a rear edge a high-resistance part having higher resistance than another portion;
a stopper mechanism limiting movement of the module of conversion circuit so that the first to third terminals may respectively contact the fourth to sixth terminals at positions further on the front edge sides thereof than the high-resistance parts;
a voltage sensor detecting voltage of the capacitor; and
a control unit including a determination section determining based on the voltage of the capacitor detected by the voltage sensor whether or not charging of the capacitor has been completed and a stopper control section controlling the stopper mechanism to release the limit of movement of the module of conversion circuit when it is determined that charging of the capacitor has been completed.

2. The power conversion apparatus according to claim 1, wherein
the high-resistance part of the third terminal has a higher resistance value than those of the first and second terminals.

3. A power conversion apparatus comprising:
a module of conversion circuit including a first switching element, a second switching element connected in series to the first switching element, a first terminal connected to the first switching element, a second terminal connected to the second switching element, a capacitor connected to the first terminal and the second terminal, and a third terminal connected to a connection point between the first switching element and the second switching element;
a fourth terminal engaged with the first terminal;
a fifth terminal engaged with the second terminal; and
a sixth terminal engaged with the third terminal, wherein
the first and second terminals have at portions thereof between front edges and rear edges high-resistance parts having higher resistance than other portions; and
the third terminal has at a portion thereof between a front edge and a rear edge a high-resistance part having higher resistance than another portion;
a position sensor detecting a position of at least one out of the first to third terminals;
a control unit determining based on the position detected by the position sensor whether or not the first to third terminals respectively contact the fourth to sixth terminals further on the rear edge sides thereof than the high-resistance parts; and
a display unit displaying a result determined by the control unit.

4. The power conversion apparatus according to claim 3, further comprising:
a voltage sensor detecting voltage of the capacitor;
wherein the control unit determines based on the voltage of the capacitor detected by the voltage sensor whether or not charging of the capacitor has been completed.

5. A power conversion apparatus comprising:
a module of conversion circuit including a first switching element, a second switching element connected in series to the first switching element, a first terminal connected to the first switching element, a second terminal connected to the second switching element, a capacitor connected to the first terminal and the second terminal, and a third terminal connected to a connection point between the first switching element and the second switching element;
a fourth terminal engaged with the first terminal;
a fifth terminal engaged with the second terminal; and
a sixth terminal engaged with the third terminal, wherein
the first and second terminals have at portions thereof between front edges and rear edges high-resistance parts having higher resistance than other portions;
the third terminal has at a portion thereof between a front edge and a rear edge a high-resistance part having higher resistance than another portion; and
each of the first to third terminals is in a columnar shape and is configured to arrange a first part having a first resistance value, a second part having a second resistance value, which is higher than the first resistance value, and a third part having the first resistance in this order in a direction from a front edge to a rear edge.

6. The power conversion apparatus according to claim 5, wherein
the second part is an insulating body covered with a thin-film resistor.

7. The power conversion apparatus according to claim 5, wherein
the second part is a resistance element covered with a plastic; and
an outer circumferential surface of the second part expands.

8. The power conversion apparatus according to claim 5, wherein
the third terminal is shorter than the first and second terminals.

9. The power conversion apparatus according to claim 5, wherein
the fourth to sixth terminals are structured to respectively pinch the first to third terminals.

* * * * *